(12) United States Patent
Brennan et al.

(10) Patent No.: US 7,075,174 B2
(45) Date of Patent: Jul. 11, 2006

(54) SEMICONDUCTOR PACKAGING TECHNIQUES FOR USE WITH NON-CERAMIC PACKAGES

(75) Inventors: John McKenna Brennan, Wyomissing, PA (US); Joseph Michael Freund, Fogelsville, PA (US); Curtis James Miller, West Lawn, PA (US); Richard Handly Shanaman, III, Richland, PA (US)

(73) Assignee: Agere Systems Inc., Allentown, PA (US)

( * ) Notice: Subject to any disclaimer, the term of this patent is extended or adjusted under 35 U.S.C. 154(b) by 126 days.

(21) Appl. No.: 10/788,162

(22) Filed: Feb. 26, 2004

(65) Prior Publication Data

US 2005/0191793 A1 Sep. 1, 2005

(51) Int. Cl.
*H01L 23/495* (2006.01)
(52) U.S. Cl. ............... 257/675; 257/712; 257/E23.031; 257/E23.051; 257/E23.052

(58) Field of Classification Search .................... None
See application file for complete search history.

(56) References Cited

U.S. PATENT DOCUMENTS

| 3,946,428 A | * | 3/1976 | Anazawa et al. | ........... 257/664 |
| 6,271,581 B1 | * | 8/2001 | Huang et al. | ................ 257/666 |
| 6,511,866 B1 | | 1/2003 | Bregante et al. | |
| 6,867,492 B1 | * | 3/2005 | Auburger et al. | ........... 257/706 |

* cited by examiner

*Primary Examiner*—David A. Zarneke

(57) ABSTRACT

A method for attaching at least one IC die to a non-ceramic IC package including a leadframe and a base, the IC package being configured for receiving the at least one IC die, includes attaching the IC die to an upper surface of a thermal carrier in a manner which facilitates thermal transfer between the die and the carrier. The method further includes attaching the thermal carrier having the IC die attached thereto to an upper surface of the base of the IC package. In this manner, one or more IC dies may be attached to a standard plastic IC package without a significant impact on thermal transfer in the device and at a significant cost savings compared to ceramic IC packages.

20 Claims, 1 Drawing Sheet

SEMICONDUCTOR PACKAGING TECHNIQUES FOR USE WITH NON-CERAMIC PACKAGES

FIELD OF THE INVENTION

The present invention relates generally to semiconductor devices, and more particularly relates to improved techniques for packaging one or more integrated circuit dies in a non-ceramic package.

BACKGROUND OF THE INVENTION

Power semiconductor devices, such as, for example, radio frequency (RF) power amplifiers fabricated using a laterally diffused metal-oxide-semiconductor (LDMOS) process technology, often comprise multiple integrated circuit (IC) dies per package, at least in part, to help facilitate current handling requirements of the device. One or more of these IC dies can generate junction temperatures in excess of 200 degrees Celsius under normal operation. Consequently, it is critical that a package to which the IC dies are attached has sufficient electrical and heat transfer characteristics so as to allow the packaged semiconductor device to efficiently dissipate this heat.

Most power semiconductor devices employ a ceramic IC package. Ceramic IC packages offer excellent thermal transfer properties. However, ceramic packages are expensive, and in a mass production environment, the ceramic package becomes a primary manufacturing cost of the packaged semiconductor device. While plastic packages are significantly less costly, the plastic package cannot withstand the high temperatures (e.g., about 400 degrees Celsius) generally required for eutectic die attach or soldering, which are typical processes used to secure the die to the IC package. Consequently, alternative methodologies, such as, for example, low-temperature solder or thermal epoxy, are often used to attach the die to the plastic package. These alternative attachment means, however, can significantly reduce the thermal transfer and/or electrical properties of the device and are thus undesirable.

U.S. Pat. No. 6,511,866 to Bregante et al. describes a known methodology that enables eutectic die attach to be used in conjunction with a plastic package. In accordance with this methodology, the plastic package is formed in three separate parts, namely, a base, a sidewall frame and a lid, that are subsequently assembled. First, the plastic sidewall frame of the package is formed by injection molding plastic material over a leadframe. Next, the IC die is attached, using a process such as eutectic bonding, directly to the base of the package. The assembled base is then attached to the bottom of the sidewall frame with an epoxy coating. Finally, the package lid is sealed to the top of the sidewall frame after the die is wire bonded to the leadframe. Although this process may be less expensive than using a ceramic package, a customized plastic package is required, which is still more costly compared to using a standard plastic package. Additionally, because the custom plastic package must be manufactured in three separate parts (i.e., sidewall frame, base and lid), additional steps are required to assemble the package, thus resulting in a lower throughput rate compared to standard plastic IC packaging.

There exists a need, therefore, for an improved semiconductor packaging technique for attaching one or more IC dies in a semiconductor device, that does not suffer from one or more of the problems exhibited by conventional IC packaging methodologies.

SUMMARY OF THE INVENTION

The present invention meets the above-noted need by providing, in an illustrative embodiment, improved techniques for packaging one or more IC dies in a semiconductor device, without the need for utilizing a ceramic package or other custom IC package. The packaging techniques of the present invention, therefore, provide a significant cost reduction compared to conventional packaging methodologies, without a significant impact on the thermal transfer and/or electrical characteristics of the semiconductor device.

In accordance with one aspect of the invention, a method is provided for attaching at least one IC die to a non-ceramic IC package including a leadframe and a base, the IC package being configured for receiving the at least one IC die. The method includes the steps of attaching the IC die to an upper surface of a thermal carrier in a manner which facilitates thermal transfer between the at least one IC die and the thermal carrier; and attaching the thermal carrier having the IC die attached thereto to an upper surface of the base of the IC package. The thermal carrier is preferably attached to the base of the package in a manner which facilitates thermal transfer between the thermal carrier and the base. In this manner, one or more IC dies may be attached to a standard plastic IC package without a significant impact on thermal transfer in the device.

In accordance with another aspect of the invention, a semiconductor device includes a thermal carrier and at least one integrated circuit die attached to an upper surface of the thermal carrier in a manner which facilitates thermal transfer between the at least one integrated circuit die and the thermal carrier. The semiconductor device further includes an integrated circuit package including a leadframe and a base, the integrated circuit package being configured for receiving the at least one integrated circuit die and thermal carrier. The thermal carrier is attached to an upper surface of the base of the package.

These and other features and advantages of the present invention will become apparent from the following detailed description of illustrative embodiments thereof, which is to be read in connection with the accompanying drawings.

DETAILED DESCRIPTION OF THE INVENTION

Figure 1:
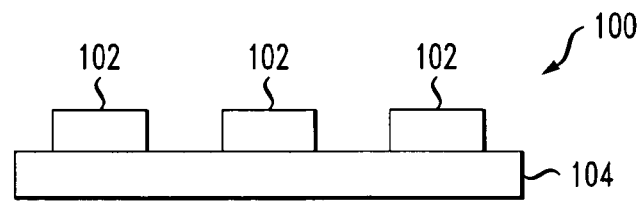
FIG. 1 is a cross-sectional view depicting at least a portion of a thermal carrier, in accordance with one aspect of the invention.

The present invention will be described herein in the context of an illustrative semiconductor device including one or more IC dies attached in a standard plastic package. It should be understood, however, that the present invention is not limited to this or any particular semiconductor device arrangement. Rather, the invention is more generally applicable to techniques for advantageously packaging one or more IC dies in a non-ceramic IC package, without significantly impacting the thermal transfer and/or electrical characteristics of the device. The use of a non-ceramic IC package, such as, but not limited to, a package formed using plastic materials, including both thermoplastic and thermosetting materials (e.g., epoxy resin, polyurethane, polyimide, polyphenylene sulfide, etc.), significantly reduces the overall cost of the semiconductor device.

The process of mounting a semiconductor die to a substrate or package is generally known as die attach. Eutectic die attach, also referred to as eutectic bonding, which is commonly employed in hermetic IC packages, typically uses a eutectic alloy to attach the semiconductor die to the package cavity. A eutectic alloy is an alloy with the lowest melting point possible for the metals combined in the alloy. One of the most commonly used die attach alloys in semiconductor packaging is a gold-silicon (Au—Si) alloy.

During a conventional eutectic die attach process, a gold perform is placed on top of the cavity while the package is being heated. When the die is mounted over the perform, silicon from the backside of the die diffuses into the gold perform, forming a gold-silicon alloy composition. As more silicon diffuses into the perform, the ratio of silicon to gold increases, until a eutectic ratio is achieved. The Au—Si alloy has about 97 percent gold and about 3 percent silicon and has a melting point of around 363 degrees Celsius. In order to achieve the eutectic melting point, the die attach temperature must be reasonably higher than this temperature.

As previously explained, in certain applications, such as, for example, in an RF power amplifier application employing at least one semiconductor device, the semiconductor device may include a plurality of IC dies per package (e.g., typically about 2 to about 12 dies), at least in part to increase a current handling capability of the device and/or provide additional functionality as may be required in an RF power amplifier chip set. One or more of these IC dies can generate junction temperatures exceeding 200 degrees Celsius under normal operation. Consequently, it is important that a package to which the IC dies are attached have sufficient electrical and thermal transfer properties so as to allow the packaged semiconductor device to efficiently dissipate this heat to the external environment.

A ceramic package having a copper-tungsten (Cu—W) base of a predetermined thickness (e.g., several hundred mils) is typically used to achieve a desired thermal transfer capability. Unfortunately, the cost associated with using a ceramic IC package is prohibitive. However, a plastic package, which is considerably less expensive compared to a ceramic package, cannot withstand the high temperatures (e.g., about 400 degrees Celsius) required for eutectic die attach or soldering, generally used to secure the dies to the IC package. Moreover, using alternative means to attach the dies to the plastic package, such as, for example, low-temperature soldering or thermal epoxy, can significantly reduce the thermal transfer and/or electrical properties of the device and are therefore less desirable.

Power semiconductor devices, such as, but not limited, RF LDMOS devices, are often fabricated on a relatively thin substrate (e.g., less than 2 mils thick) compared to a traditional die (e.g., generally about 8 mils thick or more). This allows greater thermal transfer between the die and the surrounding package to which the die is attached. Thus, while it is beneficial to utilize thin dies in forming a power semiconductor device, another noted disadvantage of using plastic IC packages is that the conventional plastic packaging process is typically not able to handle such thin IC dies in production without a significant drop in yield.

FIG. 1 is a cross-sectional view of at least a portion of an exemplary semiconductor device in which the techniques of the present invention are implemented. The figure illustrates an important aspect of the invention which advantageously enables one or more IC dies to be attached to a plastic IC package, or other inexpensive IC package, without suffering from one or more of the problems typically associated with conventional plastic IC packaging technology. The semiconductor device 100 includes a plurality of IC dies 102 on an upper surface of a die attach carrier 104, which may be referred to herein as a sled. The sled 104 facilitates production handling of the IC dies 102, which may be relatively thin in cross section (e.g., less than 2 mils). Additionally, the sled 104 functions as a heat sink for transferring heat away from the dies 102.

Sled 104 is preferably substantially thin in cross section, such as, for example, about 5 mils to about 25 mils, although the invention is not limited to a particular thickness of the sled. Additionally, the sled 104 comprises a material having sufficient thermal transfer and/or electrical properties as may be necessary to meet desired specifications for the device. The sled 104 may comprise, for example, copper-tungsten, copper, aluminum, copper alloys, or aluminum alloys, although the invention is not limited to these materials. Although a thicker sled may provide more beneficial thermal transfer properties, the thickness of the sled may be limited, at least in part, by certain characteristics of an IC package to which the sled is attached, such as, for example, the physical dimensions of the package. It is to be appreciated that the present invention is not limited to particular shapes and/or dimensions of the sled 104. For instance, sled 104 may alternatively be formed as a circular or oval disc (not shown), rather than being rectangular or square in shape.

One or more of the IC dies 102 are preferably attached to the sled 104 in such a manner that the thermal transfer between the dies and the sled is optimized. Although the present invention is not limited to a particular die attach process, three known methodologies will be described herein which may be used for attaching one or more dies 102 to the sled 104, namely, eutectic die attach, soldering and epoxying. In an epoxy die attach process, an adhesive, which may include, for example, a polyimide- or silicone-based material, is used for attaching the die 102 to the sled 104. Depending on the sled design, adhesion may be directly to copper, silver plating, nickel plating, gold plating, etc. The die attach material may be filled with silver particles of a desired concentration, or alternative conductive particles, as will be understood by those skilled in the art, to increase the thermal transfer properties of the material. When using an epoxy die attach, a layer of a metal, such as, but not limited to, gold, nickel, silver, etc., may be formed on an upper surface of the sled 104 (often referred to as top coating), although no specific top coat is required. After placement of the die 102, the die attach is typically cured at a temperature in a range from about 125 degrees Celsius to about 175 degrees Celsius.

Solder may also be employed as a die attach material between one or more dies 102 and the sled 104. The solder material generally comprises a gold-tin base, but may alternatively comprise other materials, such as, for example, a lead-tin base. Solder provides an excellent mechanical bond with superior thermal dissipation properties compared to polymer die attach. As in the epoxy die attach process, a layer of metal (e.g., gold, nickel, or silver) is preferably applied to the upper surface of the sled 104 to facilitate solder flow. Temperatures used in solder die attach typically range from about 260 degrees Celsius to about 345 degrees Celsius, depending on the solder metallurgy used.

In a preferred embodiment of the invention, one or more IC dies 102 are attached to the sled 104 by eutectic die attach, such as, for example, using a gold-silicon eutectic material. As previously stated, during the eutectic die attach process, the temperature of the IC die and sled must be raised above the eutectic melting point of the eutectic alloy (e.g., about 363 degrees Celsius for gold-silicon eutectic). Since the eutectic die attachment can be performed externally to the plastic package, the melting or package deformation that would otherwise occur if the plastic package was elevated to the eutectic temperature, can be advantageously eliminated using the techniques of the present invention. Prior to attaching the die 102 to the sled 104, a layer of metal, preferably gold for a gold-silicon eutectic, is applied to the upper surface of the sled 104. At the elevated process temperatures, silicon from the die diffuses into the gold on the upper surface of the sled to form a liquid material. The liquid material readily wets a backside and substrate metallization of the die 102 to form the gold-silicon eutectic die attach.

In a preferred embodiment of the invention, eutectic die attach is used between an IC die 102 and the sled 104 since it offers the thinnest bond (e.g., less than about 3 microns thick) compared to either epoxy or solder die attach (e.g., typically about 10 to 20 microns thick). Therefore, eutectic die attach beneficially provides greater thermal transfer between the die 102 and the sled 104, compared to epoxy and solder die attach methodologies.

Figure 2:
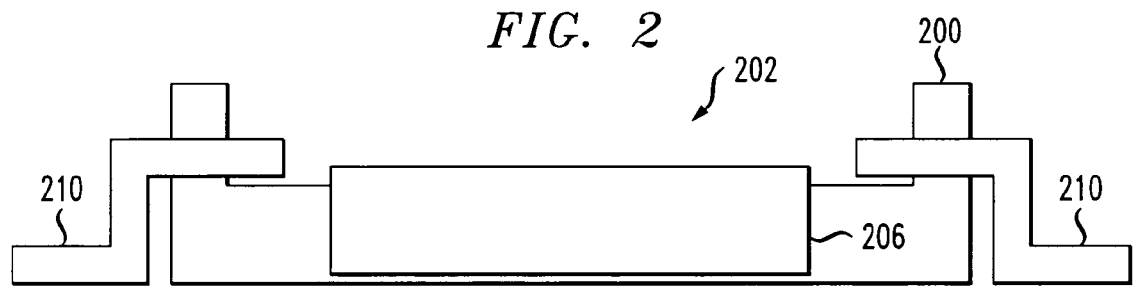
FIG. 2 is a cross-sectional view illustrating at least a portion of a standard plastic IC package.

FIG. 2 is a cross-sectional view illustrating at least a portion of a standard plastic IC package 200 including a leadframe 210 and a base 206. The base 206 is often formed of a metal (e.g., copper) and is configured for supporting the IC dies, which are subsequently connected to the leadframe 210 during wire bonding. The leadframe 210 and base 206 are typically molded into the plastic package 200 using conventional molding techniques, such as, for example, injection molding, transfer molding, insert molding, etc., depending on the materials used to form the package, as will be understood by those skilled in the art. The IC package 200 preferably includes a receptacle 202 formed therein which is configured for receiving the sled 104 and IC dies 102 attached thereto, as previously described in conjunction with FIG. 1.

Figure 3:
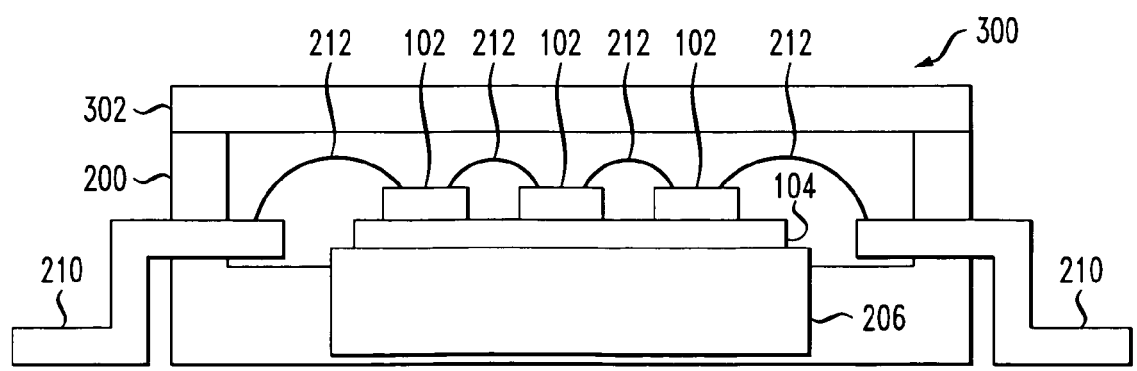
FIG. 3 is a cross-sectional view depicting at least a portion of a packaged semiconductor device, formed in accordance with an illustrative embodiment of the invention.

FIG. 3 is a cross-sectional view depicting at least a portion of a packaged semiconductor device 300, formed in accordance with an illustrative embodiment of the invention. The semiconductor device 300 preferably includes plastic IC package 200, one or more IC dies 102 attached to the sled 104, and a lid 302 which, like the IC package 200, may be formed of a plastic material (e.g., using a conventional molding process). As previously stated, the IC package 200 may comprise alternative non-ceramic materials, such as, but not limited to, thermoplastic and thermosetting materials (e.g., epoxy resin, polyurethane, polyimide, polyphenylene sulfide, etc.). As shown in FIG. 2, the IC package 200 includes a receptacle formed therein which is configured for receiving the sled 104 with the one or more IC dies 102 attached thereto.

The sled 104 may be attached to the base 206 of the package 200 using, for example, an epoxy or solder, although the invention is not limited to these attachment methodologies. Due to the elevated temperatures required, a eutectic attachment process cannot be used to attach the sled 104 to the base 206. However, eutectic die attach can be advantageously used to attach the one or more IC dies 102 to the sled 104, as described above. Furthermore, the sled 104 is preferably configured such that the thermal transfer and/or electrical properties associated therewith are sufficient on its own to meet the semiconductor device specifications. In fact, while preferred, it is not a requirement of the present invention that the base be comprised of a thermally conductive material. Consequently, while thermal transfer between the sled 104 and package base 206 may help facilitate heat dissipation in the device, the attachment methodology used for attaching the sled 104 to the base 206 of the IC package 200 is not of primary concern.

After attaching the sled 104 to the package base 206, wire bonding may be performed, whereby bond wires 212 are attached to the one or more IC dies 102 for providing electrical connection between a given die and the leadframe 210 of the package 200, and/or between multiple IC dies 102, as will be understood by those skilled in the art. The lid 302 is then attached to the IC package 200, thereby encapsulating the IC dies 102 for environmental protection.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A method for attaching at least one integrated circuit (IC) die to a non-ceramic IC package including a leadframe and a plastic base, the IC package being configured for receiving the at least one IC die, the method comprising the steps of:

attaching the at least one IC die to an upper surface of a thermal carrier in a manner which facilitates thermal transfer between the at least one IC die and the thermal carrier; and attaching the thermal carrier having the at least one IC die attached thereto to an upper surface of the plastic base of the IC package.

2. The method of claim 1, wherein the step of attaching the at least one die to the thermal carrier comprises the step of eutectic die attaching.

3. The method of claim 2, wherein the eutectic die attaching step comprises gold-silicon eutectic bonding.

4. The method of claim 1, wherein the step of attaching the at least one die to the thermal carrier comprises the step of soldering.

5. The method of claim 4, wherein the step of soldering comprises gold-tin soldering.

6. The method of claim 1, wherein the step of attaching the at least one die to the thermal carrier comprises the step of epoxying.

7. The method of claim 1, wherein the thermal carrier comprises a material selected from the group consisting of copper, copper tungsten, aluminum, copper alloys, and aluminum alloys.

8. The method of claim 1, further comprising the step of forming a layer of conductive material on the upper surface of the base prior to attaching the thermal carrier to the base.

9. The method of claim 8, wherein the conductive layer comprises a metal selected from the group consisting of gold, silver, and nickel.

10. The method of claim 1, wherein a thickness of the thermal carrier is in a range from about 5 thousandths of an inch to about 25 thousandths of an inch.

11. The method of claim 1, wherein a thickness of the at least one die is less than about two thousandths of an inch.

12. The method of claim 1, wherein the step of attaching the thermal carrier to the base of the IC package is performed in a manner which facilitates thermal transfer between the thermal carrier and the package base.

13. A semiconductor device, comprising:
  a thermal carrier;
  at least one integrated circuit die attached to an upper surface of the thermal carrier in a manner which facilitates thermal transfer between the at least one integrated circuit die and the thermal carrier; and
  an integrated circuit package including a leadframe and a base, the integrated circuit package being configured for receiving the at least one integrated circuit die and thermal carrier, the thermal carrier being attached to an upper surface of the base of the package.

14. The device of claim 13, wherein the at least one integrated circuit die is attached to the thermal carrier by a eutectic die attach process.

15. The device of claim 13, wherein the at least one integrated circuit die is attached to the thermal carrier by at least one of a solder process and an epoxy process.

16. The device of claim 13, wherein the thermal carrier is attached to the base of the integrated circuit package by at least one of a solder process and an epoxy process.

17. The device of claim 13, wherein the thermal carrier comprises a material selected from the group consisting of copper, copper tungsten, aluminum, copper alloys, and aluminum alloys.

18. The device of claim 13, wherein the thermal carrier comprises a sled.

19. The device of claim 13, wherein a thickness of the thermal carrier is from about 5 thousandths of an inch to about 25 thousandths of an inch.

20. The device of claim 13, wherein the integrated circuit package comprises a non-ceramic material.

* * * * *